United States Patent
Ma et al.

(10) Patent No.: US 11,501,131 B2
(45) Date of Patent: *Nov. 15, 2022

(54) NEURAL NETWORK HARDWARE ACCELERATOR ARCHITECTURES AND OPERATING METHOD THEREOF

(71) Applicant: SK hynix Inc., Gyeonggi-do (KR)

(72) Inventors: Kenneth C. Ma, Cupertino, CA (US); Dongwook Suh, Saratoga, CA (US)

(73) Assignee: SK hynix Inc., Gyeonggi-do (KR)

( * ) Notice: Subject to any disclaimer, the term of this patent is extended or adjusted under 35 U.S.C. 154(b) by 963 days.

This patent is subject to a terminal disclaimer.

(21) Appl. No.: 15/675,390

(22) Filed: Aug. 11, 2017

(65) Prior Publication Data

US 2018/0075344 A1    Mar. 15, 2018

Related U.S. Application Data

(60) Provisional application No. 62/385,747, filed on Sep. 9, 2016.

(51) Int. Cl.
  *G06N 3/04*  (2006.01)
  *G06N 3/08*  (2006.01)
  (Continued)

(52) U.S. Cl.
  CPC .............. *G06N 3/04* (2013.01); *G06F 7/026* (2013.01); *G06F 7/48* (2013.01); *G06N 3/049* (2013.01);
  (Continued)

(58) Field of Classification Search
  CPC ...... G06N 3/04; G06N 3/0454; G06N 3/0481; G06N 3/049; G06N 3/06; G06N 3/063;
  (Continued)

(56) References Cited

U.S. PATENT DOCUMENTS

2010/0257130 A1* 10/2010 Smallridge .............. G06N 3/02
    706/25
2014/0032458 A1* 1/2014 Sinyavskiy ............ G06N 3/049
    706/16
(Continued)

FOREIGN PATENT DOCUMENTS

KR    10-2016-0010477 A    1/2016
KR    10-2016-0063908 A    6/2016

OTHER PUBLICATIONS

Kim et al., "A Reconfigurable Digital Neuromorphic Processor with Memristive Synaptic Crossbar for Cognitive Computing," in 11.4 ACM J. Emerging Tech. Computing Sys. 1-25 (2015). (Year: 2015).*

(Continued)

*Primary Examiner* — Kamran Afshar
*Assistant Examiner* — Ryan C Vaughn
(74) *Attorney, Agent, or Firm* — IP & T Group LLP

(57) ABSTRACT

A memory-centric neural network system and operating method thereof includes: a processing unit; semiconductor memory devices coupled to the processing unit, the semiconductor memory devices containing instructions executed by the processing unit; a weight matrix constructed with rows and columns of memory cells, inputs of the memory cells of a same row being connected to one of axons, outputs of the memory cells of a same column being connected to one of neurons; timestamp registers registering timestamps of the axons and the neurons; and a lookup table containing adjusting values indexed in accordance with the timestamps, wherein the processing unit updates the weight matrix in accordance with the adjusting values.

18 Claims, 11 Drawing Sheets

(51) Int. Cl.
*G06N 3/063* (2006.01)
*G06F 7/02* (2006.01)
*G06N 3/06* (2006.01)
*G11C 11/54* (2006.01)
*G06N 5/04* (2006.01)
*G06F 7/48* (2006.01)
*G11C 13/00* (2006.01)

(52) U.S. Cl.
CPC ......... *G06N 3/0454* (2013.01); *G06N 3/0481* (2013.01); *G06N 3/06* (2013.01); *G06N 3/063* (2013.01); *G06N 3/084* (2013.01); *G06N 3/088* (2013.01); *G11C 13/0002* (2013.01); *G06F 2207/4824* (2013.01); *G06N 5/04* (2013.01); *G11C 11/54* (2013.01)

(58) Field of Classification Search
CPC .......... G06N 3/084; G06N 3/088; G06N 5/04; G06F 7/026; G06F 7/48; G06F 2207/4824; G11C 13/0002; G11C 11/54
See application file for complete search history.

(56) References Cited

U.S. PATENT DOCUMENTS

2015/0317557 A1* 11/2015 Julian .................... G06N 3/049
706/25
2016/0321537 A1* 11/2016 Akopyan .................. G06F 9/50
2017/0091621 A1* 3/2017 Gokmen ............. G06N 3/0635
2017/0185890 A1* 6/2017 Yasuda ................. G06N 3/049
2017/0185891 A1* 6/2017 Hosokawa ............. G06N 3/088
2019/0043562 A1* 2/2019 Li ....................... G11C 13/0011

OTHER PUBLICATIONS

Seo et al., "A45nm CMOS Neuromorphic Chip with a Scalable Architecture for Learning in Networks of Spiking Neurons," in 2011 IEEE Custom Integrated Circuits Conf. (2011). (Year: 2011).*
Serrano-Gotarredona et al., "A Proposal for Hybrid Memristor-CMOS Spiking Neuromorphic Learning Systems," in 13.2 IEEE Circuits and Sys. Mag. 74-88 (2013). (Year: 2013).*
Tsai et al., "LATTE: Low-[P]ower Audio Transform with TrueNorth Ecosystem,"in Int'l Joint Conf. Neural Networks 4270-77 (2016). (Year: 2016).*
Bichler et al., "Design Exploration Methodology for Memristor-Based Spiking Neuromorphic Architectures with the Xnet Event-Driven Simulator," in 2013 IEEE/ACM Int'l Symp. Nanoscale Architectures 7-12 (2013). (Year: 2013).*
Chi P et al., Prime: A Novel Processing-In-memory Architecture for Neural Network Computation in ReRAM-based Main Memory, 2016, pp. 27-39, 2016 ACM/IEEE 43rd Annual international Symposium on Computer Architecture.
Office Action issued by the USPTO for U.S. Appl. No. 15/675,358 dated Oct. 19, 2020.

* cited by examiner

NEURAL NETWORK HARDWARE ACCELERATOR ARCHITECTURES AND OPERATING METHOD THEREOF

CROSS-REFERENCE TO RELATED APPLICATION

This application claims the benefit of U.S. Provisional Application No. 62/385,747 filed Sep. 9, 2016, the entire contents of which are incorporated herein by reference.

BACKGROUND

Field of Invention

The exemplary embodiments of the present invention relate to computing systems, and more particularly to neural network hardware accelerator architectures and operating methods thereof.

Description of Related Arts

The continued success of Deep Neural Networks (DNNs) in inference and classification tasks has generated huge interest in many industries and Deep Learning (DL) is being applied to ever increasing categories of applications every day.

While a Graphics Processing Unit (GPU) has demonstrated very high computation performance and flexibility, its von Neumann-based architecture shown in FIG. 1, neither delivers optimal performance or energy, nor meets the power envelope for deployment in mobile devices. Moreover, the memory bandwidth cannot easily scale with increasing dataset size and task complexity beyond the von-Neumann bottlenecks.

In recent years, the quest for domain-specific architecture to accelerate DL applications has sparked. There are many different implementations and research in advanced acceleration architectures, such as Neural Network (NN) hardware accelerator architectures.

There are many types of Neural Networks (NNs), such as an Artificial Neural Network (ANN) and a Spiking Neural Network (SNN). The architectures of the ANN and SNN accelerators have similarities. However, the ANN and SNN utilize different techniques on how the data is fed through efficiently and how to accelerate the data; ANN and SNN are also different in terms of computation complexity, memory bandwidth considerations for neurons, and synaptic weights.

Thus, there remains a need for an optimized neural network hardware accelerator architecture and operating method thereof. In view of the ever-increasing need to improve performance and efficiency, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a neural network hardware accelerator architecture and operating method thereof capable of improving the performance and efficiency of a neural network accelerator.

In accordance with an embodiment of the present invention, an operating method of a memory-centric neural network system includes: providing a processing unit; providing semiconductor memory devices coupled to the processing unit, the semiconductor memory devices containing instructions executed by the processing unit; connecting a weight matrix to axons and neurons, the weight matrix is constructed with rows and columns of memory cells, inputs of the memory cells of a same row are connected to one of the axons, outputs of the memory cells of a same column are connected to one of the neurons; registering timestamps of the axons and the neurons into timestamp registers; looking up adjusting values from a lookup table, the adjusting values of the lookup table being indexed in accordance with the timestamps; and updating the weight matrix in accordance with the adjusting values by the processing unit.

In accordance with an embodiment of the present invention, a memory-centric neural network system comprises: a processing unit; semiconductor memory devices coupled to the processing unit, the semiconductor memory devices containing instructions executed by the processing unit; a weight matrix constructed with rows and columns of memory cells, inputs of the memory cells of a same row are connected to one of the axons, outputs of the memory cells of a same column are connected to one of the neurons; timestamp registers registering timestamps of the axons and the neurons; and a lookup table containing adjusting values indexed in accordance with the timestamps, the processing unit updating the weight matrix in accordance with the adjusting values.

DETAILED DESCRIPTION

Figure 1:
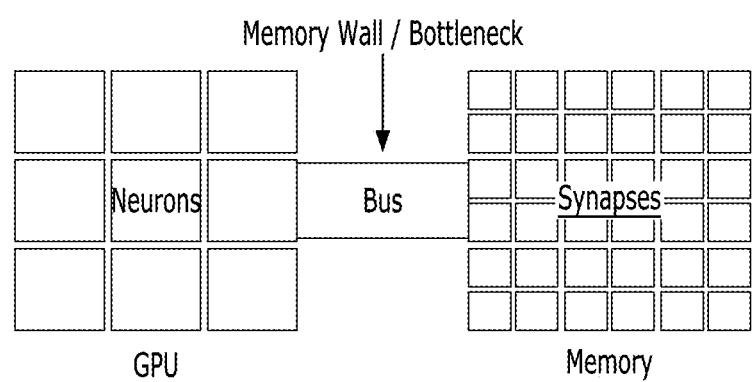
FIG. 1 is a top-level block diagram schematically illustrating a von Neumann-based architecture (prior art).

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

There are many types of neural networks (NNs) architecture, such as an Artificial Neural Network (ANN), a Spiking Neural Network (SNN), and a Sparse Distributed Memory (SDM). Within the ANN category alone, there are many variations in architectures, topologies, shapes, depths and/or operational theories even for ANNs having similar structures.

ANNs employ a computational approach which is based on a large collection of neural units loosely modeling the way the brain solves problems with large clusters of biological neurons connected by axons. Each neural unit is connected with many others, and links can be enforcing or inhibitory in their effect on the activation state of connected neural units. Each individual neural unit may have a summation function which combines the values of all its inputs together. There may be a threshold function or limiting function on each connection and on the unit itself, such that it must surpass itself before it can propagate to other neurons.

The "neuron" and "synaptic weights" are common elements in the ANN. The synaptic weights refer to the strength or amplitude of a connection between two nodes, corresponding to the amount of influence the firing of one neuron has on another. The ANNs are self-learning and trained (bidirectional) rather than explicitly programmed (unidirectional), and excel in areas where the solution or feature detection is difficult to express in traditional computer program and architecture.

SNNs are believed to operate closer to how biological neurons and synapses may work. The SNN neurons mimic the physical operations of how human neurons fire and synaptic weights by performing spatio-temporal integration of synaptic inputs, and generates output spike (firing) if the integrated result exceeds the threshold, which is transmitted by its axon driver through synapses to the other neurons. The idea is that the SNN neurons do not fire at each propagation cycle, as happens with the ANN, but rather fire only when a membrane potential, an intrinsic quality of the neuron related to its membrane electrical charge, reaches a specific value. When the neuron fires, it generates a signal which travels to other neurons which, in turn, increase or decrease their potentials in accordance with this signal. The spatio-temporal integration can integrate both space and time information, such as synaptic inputs in digital domain.

An SDM is an architecture capable of storing large patterns and retrieving the patterns based on partial matches with current sensory inputs. The SDM exhibits behaviors previously unapproachable by machines, both in theory and in experiment. The behaviors can include rapid recognition of faces or odors, discovery of new connections between seemingly unrelated ideas, continuation of a sequence of events when given a cue from the middle, knowing that one doesn't know, or getting stuck with an answer on the tip of one's tongue. The behaviors are within reach of machines that can be incorporated into the computing systems of robots capable of seeing, talking, and manipulating. The SDM is a new interpretation of learning and cognition that respects biology and the mysteries of individual human beings.

Figure 2:
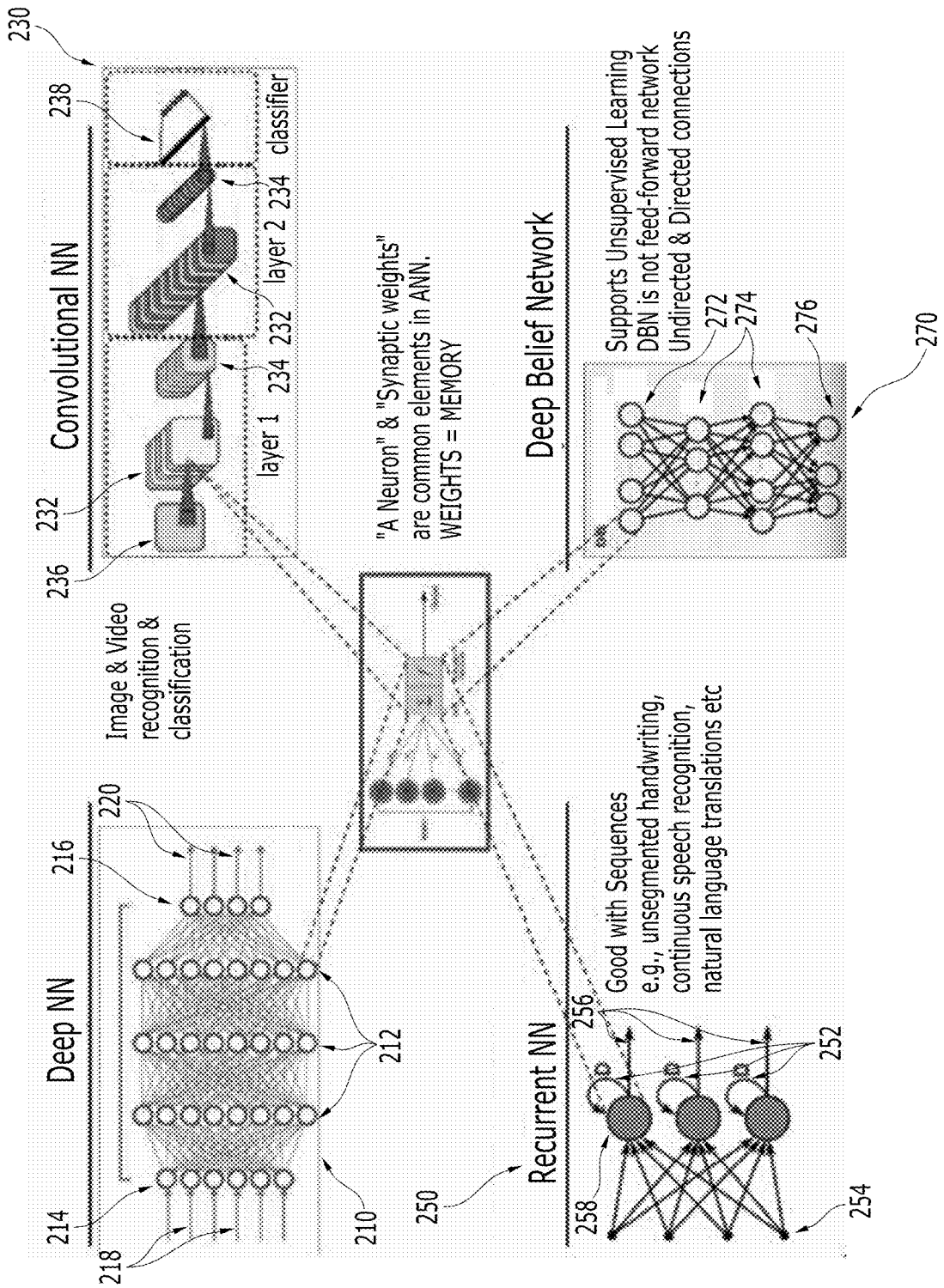
FIG. 2 is a top-level block diagram schematically illustrating various types of Artificial Neural Networks (ANNs).

Referring now to FIG. 2, therein is shown a top-level block diagram schematically illustrating various types of ANNs in accordance with an embodiment of the present invention.

The "neuron" and "synaptic weights" are common elements in the ANN, although computation, non-linear activation, and optional subsampling functions can be different among different ANN types and applications. The ANN can include, but is not limited to, deep NN 210, convolutional NN 230, recurrent NN 250, and deep belief network 270.

In general, if there is more than one hidden layer, the ANN can be a simple fully connected neural network, such as the DNN 210 or DL. The DNN 210 can have multiple hidden layers 212 of units between an input layer 214 and output layer 216, and can model complex non-linear relationships therebetween. The input layer 214 can comprise multiple inputs 218, wherein each of the inputs 218 can be processed through multiple hidden layers 212. In the DNN 210 architectures, compositional models can be utilized to generate the outputs 220 of the output layer 216, wherein the outputs 220 can be expressed as a layered composition of the inputs 218 of the input layer 214. The upper layers can enable composition of features from lower layers, giving the potential of modeling complex data with fewer units, wherein the upper layers can be close to the output layer 216 than the lower layers.

If the ANN involves one or more layers of convolution operations, the ANN can be the Convolutional Neural Network (CNN) 230. Convolution is a mathematical operation on two functions to produce a third function. The convolution is typically viewed as a modified version of one of the original functions, giving the integral of the pointwise multiplication of the two functions as a function of the amount that one of the original functions is translated.

The CNN 230 can comprise multiple layers of receptive fields, including convolutional layers 232 and pooling layers 234. The convolutional layers 232 can extend a small receptive field to the full depth of the volume of an input 236 through a set of learnable filters. A 2-dimensional activation map of the learnable filters can be produced by convolving across the entries of the filter and the input 236. The pooling layers 234 can partition the input 236 image into a set of non-overlapping rectangles, and outputs the maximum for each such sub-region. The function of the pooling layers 234 is to progressively reduce the spatial size of the representation to reduce the number of parameters and computation in the network, and to control overfitting. It is common to periodically insert one of the pooling layers 234 in-between the successive convolution layers 232 in the CNN 230 architecture. The pooling operation provides a form of translation invariance.

After several convolutional layers 232 and pooling layers 234, the high-level reasoning in the CNN 230 is performed via a fully connected layer 238. The neurons in the fully connected layer 238 can have full connections to all activations in the previous layer. Their activations can hence be computed with a matrix multiplication followed by a bias offset.

If some feedback exists between the neurons on the same layer or previous layer/layers, the ANN can be Recurrent Neural Network (RNN) 250. The RNN 250 can not only learn from errors through backpropagation 252, but also from prior inputs 254 immediately preceding current inputs 256 which helps with applications. For example, a neuron layer 258 can learn from the prior inputs 254 and the backpropagation 252. The current inputs 256 can be the inputs of a next neuron layer (not shown). The RNN 250 can be good with sequences, such as unsegmented handwriting, continuous speech recognition, and natural language translations. For example, Natural Language Processing (NLP) or voice recognition may learn from contextual information from preceding words or phonemes.

The Deep Belief Network (DBN) 270, at a high level, can refer to a DNN with unsupervised pre-training, using stacked Restricted Boltzmann Machines (RBMs), or using supervised training with labeled datasets to fine-tune the weights, wherein the RBM is a generative stochastic artificial neural network that can learn a probability distribution over its set of inputs. The DBN 270 can substantially improve training time. The DBN 270 can be obtained by stacking several RBMs on top of each other. For example, one of hidden layers 274 of the RBM at layer(i) can become the input of the subsequent hidden layers 274 of the RBM at layer(i+1). A first layer 272 of the RBM can be the input of the DBN 270, and a last layer of the RBM 276 can represent the output of the DBN 270.

All types of ANNs need to be "trained" before they can perform inference or classification functions. Typically, there are two distinct modes of ANN operations, feedforward mode for inferences and classifications, such as DNN 210, CNN 230, or DBN 270, and backpropagation or backprop mode for training or learning using the labeled training datasets, such as RNN 250. The above-described training process is called "supervised learning". The supervised learning is a form of batch learning which can generate the best predictors (set of weights) by learning on the entire training data set at once.

Figure 3:
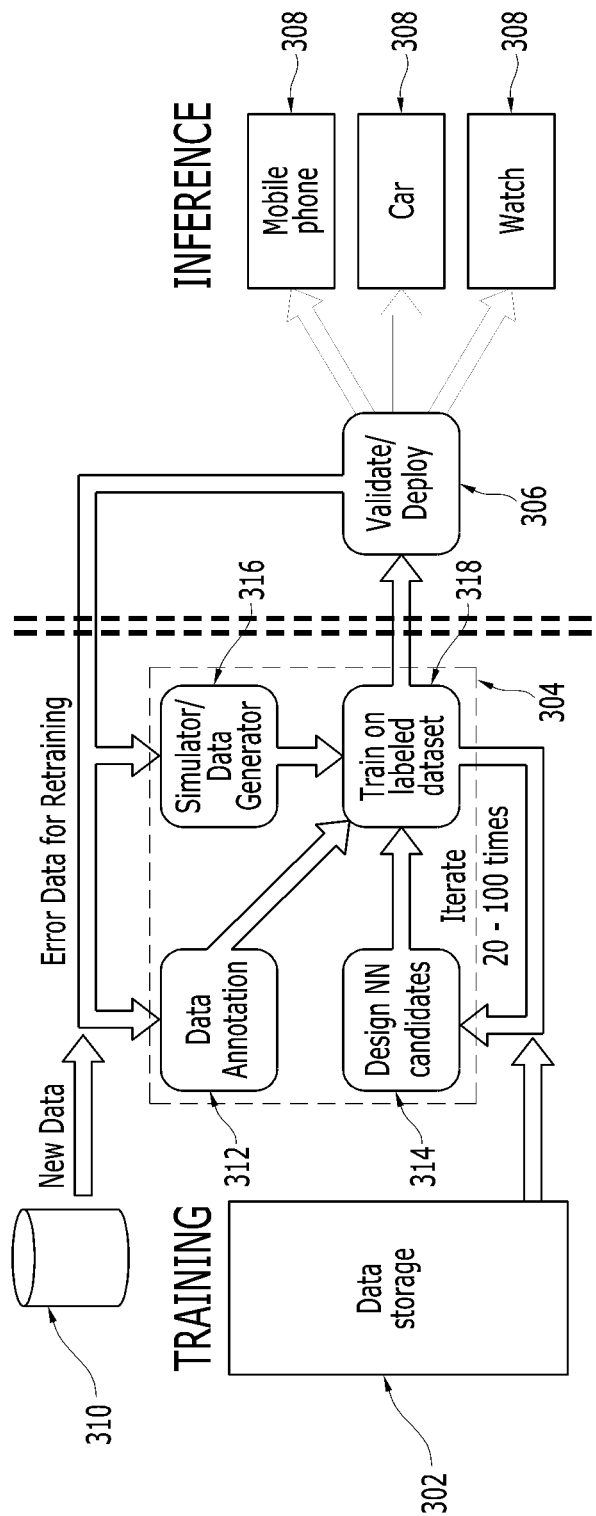
FIG. 3 is a flow chart illustrating neural network training/inference deployment flow of Artificial Neural Networks (ANNs) in accordance with an embodiment of the present invention.

Referring now to FIG. 3, herein is shown a flow chart illustrating neural network training/inference deployment flow of ANNs in accordance with an embodiment of the present invention. The flow chart can include training data sets 302, a training module 304, a validation module 306, and application devices 308.

For example, a neural "production workflow" shown in FIG. 3 demonstrates new training data 310 can be fed to the ANNs. The new training data 310 can be processed in the training module 304 in accordance with the training data sets 302. The training module 304 can include multiple sub functional modules, such as a data annotation module 312, designing NN candidates 314, and simulator/data generation module 316. The processed results of the sub functional modules can be trained on a labeled dataset, such as the training data sets 302, in a training module 318. If error occurs, the error data feedback for retraining can be iterated many times until the errors converge to a minimum and below a certain threshold of changes. Satisfactory training results can be forwarded to the validation module 306 for validation/deployment. Then the weights and parameters can be transferred to the actual application devices 308 for deployment, such as self-driving cars or autonomous drones.

Notice that there are distinctions between online learning and on-chip learning. Online learning applies to the NN and can continuously perform inferences, classifications or other NN tasks while simultaneously learning and updating the synaptic weights (predictors) without stopping the NN functions or switching to another mode, such as backprop mode. The on-chip learning circuit only implies that the chip is equipped with a circuit to perform training or learning and may or may not support online learning.

Typically, the ANN is equipped with a circuit to perform training or learning, such as the on-chip learning circuit. However, the ANN with the on-chip leaning circuit may or may not support online learning. For example, by definition, ANN backpropagation mode only supports offline training even with the on-chip learning circuit, since it cannot perform inferences or classifications while in backpropagation mode.

Figure 4:
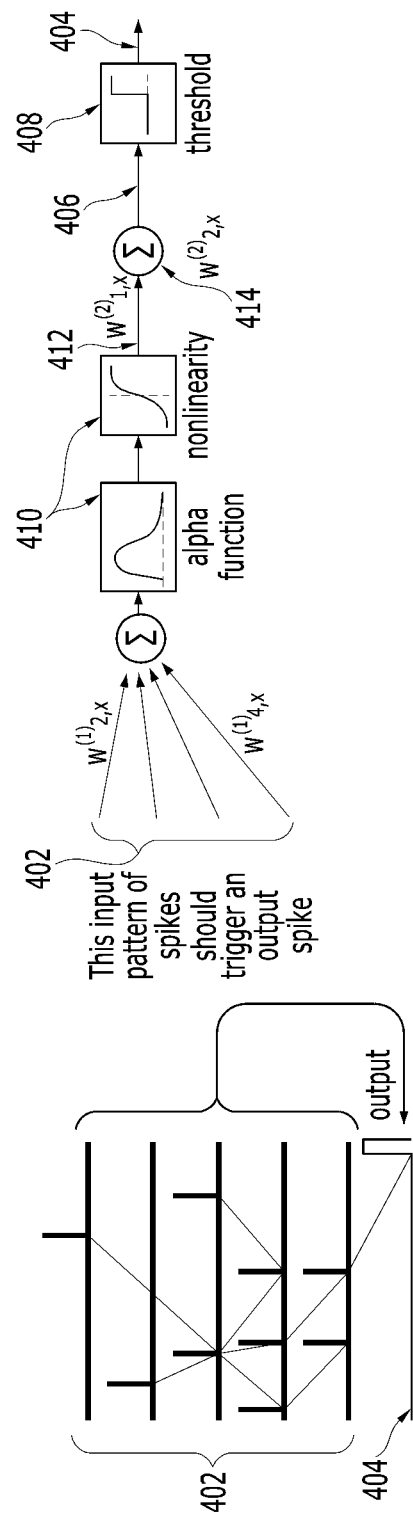
FIG. 4 is a diagram illustrating neuron performance in Spiking Neural Networks (SNNs) in accordance with an embodiment of the present invention.

Referring now to FIG. 4, herein is shown a diagram illustrating neuron performance in SNNs in accordance with an embodiment of the present invention. As shown in FIG. 4, the SNN neurons can mimic the physical operations of how human neurons fire and synaptic weights apply, by performing spatio-temporal integration of synaptic inputs 402, and generating an output spike (firing) 404 if an integrated result 406 exceeds a predetermined threshold 408. The output spike 404 can be transmitted by axon drivers thereof through synapses to the other neurons. The spatio-temporal integration can integrate both space and time information, such as the synaptic inputs in digital domain.

In an SNN, the neurons can spike or fire at different timesteps. Each neuron spiking or firing can generate an input pulse. The neuron spiking pattern can be integrated with the corresponding synaptic weights, and can be processed in accordance with mathematical functions and algorithms 410, such as alpha function and non-linearity. A processed result 412 can be integrated with the contributions from other dendritic branches 414 of the SNN, and generate the output spike 404 if the integrated result 406 passes the predetermined threshold 408.

Due to its spatio-temporal nature, the SNN typically has no backpropagation under the traditional SNN theory, since the backpropagation cannot reconstruct the time position of the spike of the previous neuron. Since a SNN-based neuromorphic processor doesn't support an on-chip learning circuit, the SNN can be trained with the equivalent SNN model off-chip first, then transfer the synaptic weights to the SNN to perform inference and classification functions.

Important characteristics of the SNN include online learning capability via a mechanism called Spike Timing Dependent Plasticity (STDP), if the SNN is supported with a proper STDP circuit and a synaptic weight updates mechanism. So, a simple distinction between the SNN and ANN is that the SNN synapses are unidirectional (feed-forward mode) while the ANN synapses are bidirectional if backpropagation mode is supported.

Figure 5:
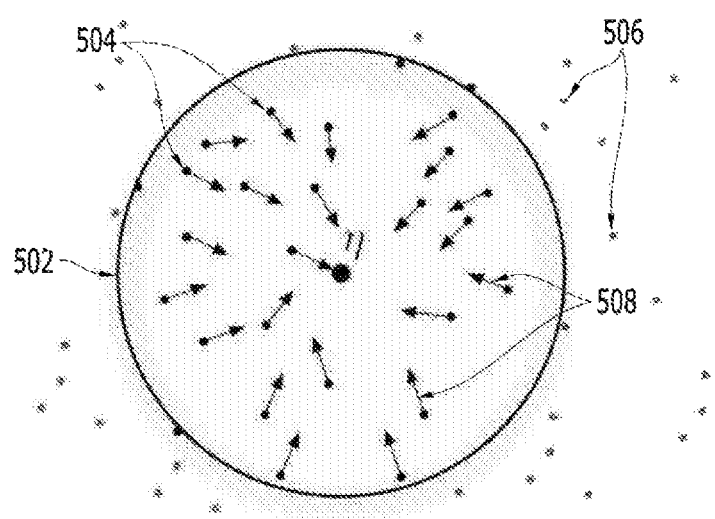
FIG. 5 is a diagram illustrating hard locations of Sparse Distributed Memory (SDM) in accordance with an embodiment of the present invention.

Referring now to FIG. 5, herein is shown a diagram illustrating hard locations of an SDM in accordance with an embodiment of the present invention. The diagram illustrates multiple neurons and hard locations thereof. The hard locations within a space represented by a circle 502 can be activated neurons 504, while the hard locations outside the circle can be non-activated neurons 506.

The SDM is a mathematical model of human long-term memory. The SDM is a type of associative memory, and the main attribute of the memory is sensitivity to similarity. The SDM can read back a word, typically a very long word such as 2048 bits, not only by giving the original or exact address, but also by giving one address close enough thereto, as measured by the number of mismatched bits, such as Hamming distance. The SDM has the ability to support online learning, if implemented.

To describe write and read operations of the SDM, the neurons, represented by the hard locations thereof in the SDM, can be visualized as vectors 508, wherein the vectors 508 can point to certain areas of the space. In the SDM model, the cell assembly, such as the set of active hard locations, can work in unison, rather like a sum of the vectors 508, such that as one writes bitstrings in memory, the counters of the hard locations can be updated.

When the bitstring activates a set of hard locations, the activated hard locations may not individually point to the bitstring activating them. But, taken together, the activated hard locations can point to a coordinate in space. In this fashion, any one of the hard locations can simultaneously point to many different areas of the space, and the set of hard locations can represent any point in the space.

In other words, both SDM reading and writing can depend on many hard locations to be successful. This effect is represented in FIG. 5, where all the hard locations of the activated neurons 504 inside the circle 502 are activated, and may not point to a bitstring η individually. But, as the vectors 508 indicate, the sum of the set of the hard locations can point to the general direction of the bitstring η. For example, if two items of data are written into the memory near the bitstring η sequentially, the shared hard locations can have information from both of the data and may not directly point to either of the items of data. All of the hard locations, inside and outside of the circle 502, may also point elsewhere to other additional data points.

Figure 6:
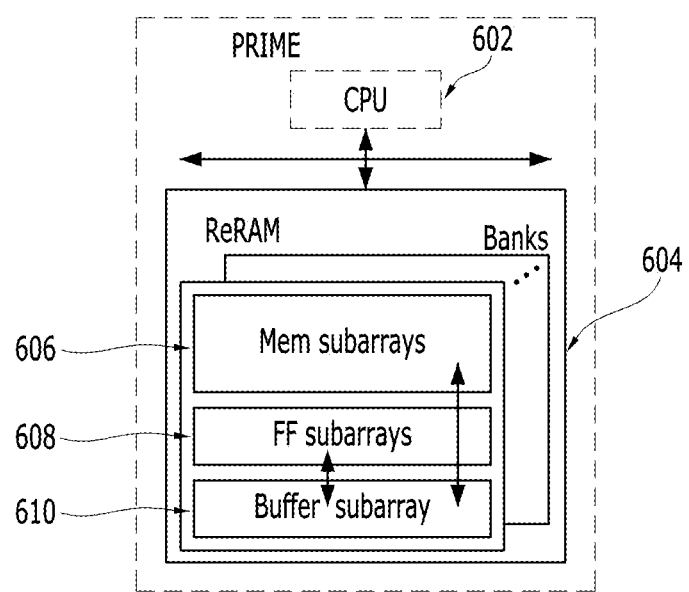
FIG. 6 is a block diagram schematically illustrating a PRIME architecture in an embodiment of the present invention.

Referring now to FIG. 6, herein is shown a block diagram schematically illustrating a PRIME architecture in an embodiment of the present invention.

PRIME or "PRocessing-In-MEmory" proposes an architecture to accelerate NN applications in DRAM-based or resistive random-access memory (ReRAM)-based main memory, or other types of memories. The PRIME can include a microarchitecture and circuit designs to enable a "morphable" function, such as full-function subarray or "FF subarray", wherein the morphable function can switch between computation and storage functions, and by careful reuse of the peripheral circuits, the PRIME can reduce die area overhead.

The PRIME can also exploit the bank-level parallelism of the ReRAM memory or DRAM memory for further acceleration and development of a software-hardware interface to optimize the NN mapping during compile time.

As shown in FIG. 6, the PRIME can include a processing unit 602, such as a CPU, and ReRAM banks 604. Each of the ReRAM banks 604 can be partitioned into three regions, such as memory (Mem) subarrays 606, full function (FF) subarrays 608 (>=2 per bank), and buffer subarrays 610 (>=1 per bank).

The Mem subarrays 606 may only have data storage capability, which is the same as conventional memory subarrays.

The FF subarrays 608 can have both computation and data storage capabilities, and operate in two modes, such as memory mode and computation mode. In the memory mode, the FF subarrays 608 can serve as a conventional memory. In the computation mode, the FF subarrays 608 can execute NN computation. A PRIME controller (not shown) can control the operation and the reconfiguration of the FF subarrays 608. The design goal for FF subarrays 608 can be supporting both storage and computation modes with minimum area overhead and maximum reuse of peripheral circuits in both modes.

The buffer subarrays 610 can serve as data buffers for the FF subarrays 608, and can be typically the memory subarrays (physically) closest to the FF subarrays 608. The buffer subarrays 610 can be connected to the FF subarrays 608 through private data ports, so that buffer accesses do not consume the bandwidth of the Mem subarrays 606. While not being used as data buffers, the buffer subarrays 610 can be used as conventional memory.

The PRIME architecture, such as ReRAM-based acceleration for ANN/CNN neural networks, can add support for the SNN LIF and the novel time multiplexed STDP concept. The time multiplexed STDP concept builds a unified NN accelerator architecture that can support both ANN/CNN and SNN LIF/STDP acceleration. The PRIME architecture can include the following key functional elements: wordline decoder and driver, modified column multiplexer, sense amplifiers, the buffer subarrays 610 and FF subarrays 608 communications, and the PRIME controller.

The computations of the PRIME architecture can require $2^n$ levels of input voltages, where n represents resolution in terms of number of input bits. The PRIME architecture can employ a multi-level voltage source "Vol", controlled through a latch and amplified by a separate current amplifier "AMP" on each wordline of the memory. A multiplexer can switch the voltage driver between the memory mode and computation mode. Two crossbar arrays can be used to store positive and negative weights, respectively, and allow them to share the same input port.

A modified column multiplexer can incorporate two analog processing units, an analog subtraction unit and a nonlinear threshold (sigmoid) unit. The output (current) from the negative weight array is subtracted from the output of the positive weight array which is then (optionally) passed to the nonlinear threshold (sigmoid) unit. Since a pair of crossbar arrays with the positive and negative weights can require only one set of such peripheral circuits, only half of the column multiplexers may need to be modified. After analog processing, the output current can be sensed by local sense amplifiers (SAs).

The NN computation can require the SAs to support much higher precision than memory function does. The PRIME can adopt $2^{Po}$ levels precision SA design that can allow the SA's precision to be configurable between 1-bit and Po-bits, where Po<=8. To allow low-precision ReRAM cells to perform NN computation with a high-precision weight, the PRIME architecture can employ a precision control circuit comprising a register and an adder. A Rectified Linear Unit (ReLU) unit can check the sign bit of the results, and output zero if the sign bit is negative, and the results can pass through if the sign bit is positive. A max pooling unit can be also included to perform the subsampling stage of the CNN layer.

The buffer subarrays 610 can serve as data buffers for the FF subarrays 608, so the PRIME design can enable the FF subarrays 608 to access any physical location in the buffer subarrays 610 to accommodate the random memory access pattern in the NN computation, such as in connections between two convolution layers.

The PRIME controller can be used to control the operation and the reconfiguration of the FF subarrays 608 in each bank. The PRIME controller can decode instructions and control the reconfiguration and operation of all the peripheral circuits in the FF subarrays 608, in both the memory mode and computation mode.

The PRIME architecture can enable flexible and efficient morphing between the two modes. In the computation mode, the FF subarrays 608 can fetch the input data of the NN from the buffer subarrays 610 into the latch of the wordline decoder and driver. After the computation in the crossbar arrays storing the positive and negative weights, the output signals of the crossbar arrays can be fed into the subtraction unit, and then the subtraction result can feed into the sigmoid unit. The analog output can be converted to a digital signal by the SA and can be written back to the buffer subarray. In the memory mode, the input can come from the read/write voltage selection, and the output can bypass the subtraction and sigmoid units.

The morphing between memory and computation modes can involve several steps. Before the FF subarrays 608 switch from memory mode to computation mode, the PRIME architecture can migrate the data stored in the FF subarrays 608 to certain allocated space in the Mem subarrays 606, and then write the synaptic weights to be used by computation into the FF subarrays 608. When data preparations are ready, the peripheral circuits can be reconfigured by the PRIME controller, and the FF subarrays 608 can be switched to the computation mode and can start to execute the mapped NNs. After completing the computation tasks, the FF subarrays 608 can be switched back to the memory mode by reconfiguring the peripheral circuits.

In a typical ReRAM-based neuromorphic computing system, digital-analog-conversion (DACs) and analog-digital-conversion (ADCs) can be used for input and output signal conversions. In order to reduce overhead, the PRIME architecture may reuse the SAs and write drivers in the memory mode to serve as the ADC and DAC functions, respectively, in the computation mode by slightly modifying the circuit design.

In summary, the PRIME architecture as an efficient memory-centric design can distinguish from prior work on NN acceleration, with significant performance improvement and energy saving.

Figure 7:
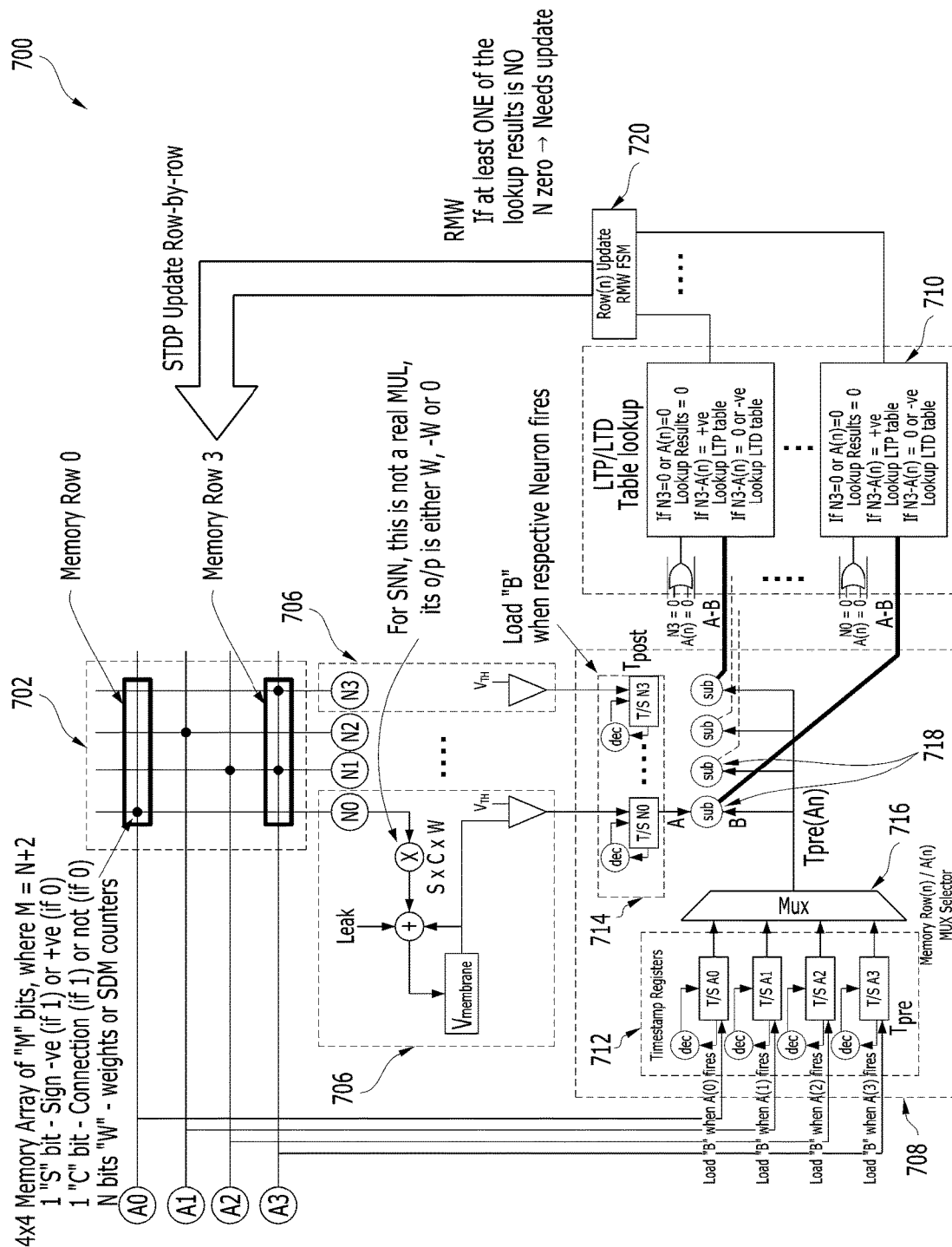
FIG. 7 is a block diagram schematically illustrating a conceptual DRAM-based time-multiplexed SNN LIF/STDP architecture in accordance with an embodiment of the present invention.

FIG. 7 is a block diagram schematically illustrating a Conceptual DRAM-based Time-Multiplexed SNN LIF/STDP architecture 700 in accordance with an embodiment of the present invention. The architecture can include a weight matrix 702, such as a DRAM array, multiple neurons 706, such as neurons N0, N1, N2 and N3, timestamp registers 708, and LTP table 710.

While many specialized hardware (HW) implementations focus on inference tasks only, a few of the specialized HW implementations target the training/backpropagation acceleration, while some of the specialized HW implementations also have optional online learning capability that provide the ability to learn from and adapt to events or inputs for which the deployed model was trained.

The NN architecture with memory-centric implementations can leverage the massive parallelism and density of memory-centric design, because of non Von-Neumann architecture and the "compute-light, memory-heavy" nature of the NN, wherein the computer light can refer to simple math operation. The memory-centric implementations can make a scalable "neural network on-a-chip" a possibility for memory vendors.

The memory-centric memory array structure can be fabricated on a memory process wafer, or be compatible with memory process, using standard or future memory cells, such as SRAM, DRAM, PCRAM, ReRAM/Memristors, in the special memory array structures, such as 2D-crossbar or 3D-crossbar structures. In the memory-centric architecture, the computation can leverage unique memory properties of the PCRAM or Memristors. The computation can be done on or near a memory die, such as Processor-In-Memory (PIM) or Processor-Near-Memory (PNM) with logic base dies. The non Von-Neumann architecture with memory elements can be closely coupled to the neurons, either physically or logically.

Due to differences in the major branches of the NN, such as the ANN, SNN, and SDM, types, sizes, layers, target applications, and options of neural network hardware acceleration architectures, the feed-forward inference, and backpropagation training or learning mechanisms can be very different, resulting in difficulty to build a unified acceleration architecture.

A novel architecture based on PRIME DRAM-based acceleration focusing on ANN/CNN, can add and support SNN feed-forward Leaky-Integrated-and-Fire (LIF) mode and a mechanism of Time-Multiplexed STDP mode for online learning, while keeping ANN/CNN accelerator functions of the architecture.

A DRAM-based, or other standard memories like SRAM based, Time-Multiplexed LIF and STDP architecture 700 can include only one weight matrix 702 of the DRAM array, with neurons 706 of N0-N3 perform LIF in digital domain. Each entry of the DRAM array can have 1 bit "C" that indicates if an axon is connected to one of the neurons 706, 1 bit "S" that indicates the weight is positive or negative, and N-bit "W" weight that contains the synaptic weight of the specific axon-neuron pair or SDM counters. A 4×4 example shown in FIG. 7 can have a DRAM array of 4×4×(N+2) bits.

For describing the architecture of a neural network HW accelerator, such as the conceptual DRAM-based Time-Multiplexed LIF and STDP, the architecture of the 4×4 array is exemplified therefor in FIG. 7. However, the architecture of the neural network HW accelerator can be easily scaled to M×M with the exact same architecture, wherein M is an integer.

The PRIME architecture can leverage the properties of the DRAM array to perform calculation efficiently. The PRIME architecture can employ the weight matrix 702 to store positive and negative weights. The initial values of the positive weights and the negative weights can be preset.

For example, the weight matrix 702 can have 4 rows and 4 columns with 16 memory entries. Each of the 16 memory entries can have one input axon, and one output neuron. The memory entries can be arrayed in rows and columns, such as entry(R, C), wherein R represents the index number of the rows and C represents the index number of the columns. For example, the entry(2,3) is the memory entry located at row 2 and column 3.

The input axon can drive a corresponding row of 4 memory entries in the weight matrix 702. Each of the memory entries can represent different weight in the weight matrix 702. The output neuron can be the integration of the inputs axons (A0, A1, A2, A3) with the corresponding weight, wherein the corresponding weight can be configured to various positive or negative values.

For example, the weight matrix 702 can have 4 rows, such as Row(0-3). The Row0 can have 4 corresponding memory entries, entry(0,0), entry (0,1), entry (0,2), and entry (0,3). The inputs of the 4 corresponding memory entries of the Row0 can be connected to input axon A0. Similarly, each of the Row1, Row2, and Row3 can have 4 corresponding memory entries, wherein the inputs of the 4 corresponding entries of row1, row2, and row3 can be connected to input axon A1, A2, and A3, respectively. The output neuron N0 can be the integration of the bit "C", bit "S", and all the memory entries on the column0, such as entry(0,0), entry (1,0), entry(2,0), and entry(3,0), representing different weights in the weight matrix 702 of the corresponding input axon A0, A1, A2, and A3 of each row.

The LIF can be relatively straight forward. The FSM can take each row of the weight matrix corresponding to input axon An, such as A0, A1, A2, and A3, and feed the (N+2) bits to the output neurons N(0-3), such as N0, N1, N2, and N3. If an input axon An fires during a specific timestep, the F bit=1, otherwise F bit=0. The neurons N(0-3) perform the following:

$$V\text{membrane} = \text{Leak} + \Sigma(F*S(+ve \text{ or } -ve)*C*W)$$

F and C bit are either 0 or 1, S bit is also 0 or 1 but affects the sign of the results, W is N-bit terms representing the weights in the equation.

The FSM repeats the above operation until all rows, An(0-3) in this example, are fed to the neurons and the Vmembrane are properly calculated. The respective neuron fires if Vmembrane>Vth.

Therefore, the Σ result is either 0, +W, or −W. The implementation need only be a simple circuit to invert the sign of the input or zero the inputs, resulting in elimination of an actual multiplier.

A more sophisticated mechanism may be used to perform the STDP. When the inputs that might be the cause of the post-synaptic neuron's excitation are made even more likely to contribute in the future, such configuration is called Long Term Potentiation (LTP). When the inputs that are not the cause of the post-synaptic spike are made less likely to contribute in the future, that is called Long Term Depression (LTD). The magnitude of the LTP and LTD depends on the causal relationship and acausal relationship, and the relative time difference between Tpre and Tpost. The Tpre can be defined as the relative timing of the pre-synaptic firing, and the Tpost can be defined as the relative timing of the post-synaptic firing. Typically, Tpre can be relative to timestamp of the axon firing and Tpost can be relative to timestamp of the neuron firing.

The novel concept in the embodiment of the present invention employs axon timestamp registers 712 of the timestamp registers 708 to register the rolling timestamps of the last firing event of the axons A0-A3, such as Tpre(A0-A3), and neuron timestamp registers 714 of the timestamp registers 708 to register rolling timestamps of last firing event of the neurons N0-N3, such as Tpost(N0-N3), in accordance with the following rules and assumptions.

1. When one of the axons fires, a corresponding Tpre timestamp register is written with a value B. The value B is decremented by a value, such as 1, in each timestep until the value B reaches 0, and stays at 0 in subsequent timesteps. The value B can be a time window bound of causal relevance between a pre-synaptic neuron and post-synaptic neuron. For example, the value B=50 millisecond (ms) can be a typical choice of an LTP/LTD time window bound of causal relevance for a 1 ms timestep.

2. When one of the neurons fires, a corresponding Tpost timestamp register is written with the value B. The value B is decremented by a value, such as 1, in each timestep until the value B reaches 0, and stays at 0 in subsequent timesteps.

3. A compare operation of Tpost and Tpre is triggered only when all of the following conditions are met: when the axons fire (Tpre=B), or the neurons fire (Tpost=B), or both the axons and the neurons fire in a specific timestep; and when neither axon Tpre=0 nor neuron Tpost=0.

4. Assume the LTP/LTD curves shown in FIG. 8 that determine synaptic weight updates are represented by a piecewise-linear table, such as "LTP/LTD Table". When Tpost−Tpre=1, the synaptic weight can be considered as a "Strong LTP". When Tpost−Tpre=0, the synaptic weight can be considered as "Weak LTD".

5. STDP operation may not overlap with LIF and may only occur after LIF is completed.

6. STDP Finite State Machine (FSM) may follow the rules mentioned above and the following steps.

1). Control selective circuit 716, such as a Mux, to select one of the axons, such as A0, A1, A2, and A3. The Mux chooses the time of the axon event for matching the timesteps of rolling timestamps. For example, the Mux chooses axon A0 when A0 fires at timestep 1, or chooses A3 when A3 fires at timestep 47, as shown in Table 1.

2). Subtract Tpre(An) of the selected axon from each Tpost(N0-N3), by comparison circuits 718.
For example, Tpost(N0)-Tpre(A0), Tpost(N1)-Tpre(A0), Tpost(N2)-Tpre(A2), and Tpost(N3)-Tpre(A3).

3). Performs LTP/LTD table lookup, using a piecewise linear table, in accordance with the results of the step 2.
If Tpost-Tpre is positive (+ve), then access LTP/LTD table 710 for the value to increase the weight in the next step.
If Tpost-Tpre is negative (−ve), then access LTD/LTD table 710 for the value to decrease the weight in the next step.
If Tpost-Tpre=0, then the lookup result is 0, and no weight increment or decrement is performed in the next step.

4). Update corresponding entries in the weight matrix 702 in a time-multiplexed manner. When at least one of the lookup results is not 0, the FSM can update each row of the weight matrix 702 in accordance with the lookup results. For example, if A0 is selected in the step 1, the Row0 can be updated. If Tpost(N1)-Tpre(A0) is positive, the FSM can increase the weight of the entry(0,1) by the lookup table result. If Tpost(N3)-Tpre(A0) is negative, the FSM can decrease the weight of the entry(0,3) by the lookup table result.

5). Control the selective circuit 716, such as the Mux, of the Timestamp Register 708 to select a next axon. Repeat steps 1-5 until all of the axons timestamps are compared and all weights updates are completed.

The conceptual DRAM-based time-multiplexed LIF and STDP architecture in the embodiment of the present invention can provide a unified accelerator architecture supporting both ANN/CNN and SNN LIF/STDP acceleration. The specified architecture provides higher performance of accurate DL including on-line learning and on-chip learning, lower latency of providing real-time or near-real-time inference and classifications, lower power of deployment of NN only when an axon or a neuron fires, and offloading CPU from heavy computation with memory-centric implementation. The architecture can achieve more accurate and faster performance, and lower the power consumption for more powerful mobile devices and real-time applications.

Referring now to Table 1, herein is shown a table illustrating timesteps of a rolling timestamps scenario in accordance with an embodiment of the present invention.

At Timestep 3:
Tpre(A0) decrement by 1, Tpre(A0)=48,
A1 fires, Tpre(A1)=50,
Tpost(N1) decrement by 1, Tpost(N1)=49, and
N3 also fires, Tpost(N3)=50. Since A1 and N3 fire, and neither Tpre nor Tpost is zero, 3 compare operations involving A0, A1 and N3 are triggered.
 a. Tpost(N3)−Tpre(A0)=2, indicates strong LTP, and thus flow proceeds to the LTP table for a value to increase the weight in the next step,
 b. Tpost(N3)−Tpre(A1)=0, indicates weak LTD, thus flow proceeds to the LTP table for a value to decrease the weight in the next step, and
 c. Tpost(N1)−Tpre(A1)=−1, indicates weak LTD, and thus flow proceeds to the LTP table for a value to decrease the weight in the next step.
Since Tpost(N1) and Tpre(A0) is compared in timestep 2, no comparison is necessary in timestep 3.

The rest of the timesteps can be interpreted in similar manner and are relatively self-explanatory.

As shown in the architecture of FIG. 7, the "Row(n) Update Read Modified Write (RMW) Finite State Machine

TABLE 1

| | Time Steps | | | | | | | | | | | | | | | | | | | | | | | | |
|---|---|---|---|---|---|---|---|---|---|---|---|---|---|---|---|---|---|---|---|---|---|---|---|---|---|
| | 0 | 1 | 2 | 3 | ... | 47 | 48 | 49 | 50 | 51 | 52 | 53 | ... | 67 | 68 | 69 | 70 | ... | 96 | 97 | 98 | 99 | 100 | 101 | 102 |
| PRE-SYNAPTIC AXONS | | | | | | | | | | | | | | | | | | | | | | | | | |
| A(0) Tpre (A0) | 0 | 50 | 49 | 48 | | 4 | 3 | 2 | 1 | 0 | 0 | 0 | | 0 | 0 | 0 | 0 | | 0 | 0 | 0 | 0 | 0 | 0 | 0 |
| A(1) Tpre (A1) | 0 | 0 | 0 | 50 | | 6 | 5 | 4 | 3 | 2 | 1 | 0 | | 0 | 0 | 0 | 0 | | 0 | 0 | 0 | 0 | 0 | 0 | 0 |
| A(2) Tpre (A2) | 0 | 0 | 0 | 0 | | 0 | 0 | 0 | 0 | 0 | 0 | 0 | | 50 | 49 | 48 | 47 | | 21 | 20 | 19 | 18 | 17 | 16 | 15 |
| A(3) Tpre (A3) | 0 | 0 | 0 | 0 | | 50 | 49 | 48 | 47 | 46 | 45 | 44 | | 30 | 29 | 28 | 27 | | 1 | 0 | 0 | 0 | 0 | 0 | 0 |
| POST-SYNAPTIC NEURONS | | | | | | | | | | | | | | | | | | | | | | | | | |
| N(0) Tpost (N0) | 0 | 0 | 0 | 0 | | 0 | 50 | 49 | 48 | 47 | 46 | 45 | | 31 | 30 | 29 | 28 | | 2 | 1 | 0 | 0 | 0 | 0 | 0 |
| N(1) Tpost (N1) | 0 | 0 | 50 | 49 | | 5 | 4 | 3 | 2 | 1 | 0 | 0 | | 0 | 0 | 0 | 0 | | 0 | 0 | 0 | 0 | 0 | 0 | 0 |
| N(2) Tpost (N2) | 0 | 0 | 0 | 0 | | 0 | 0 | 0 | 0 | 0 | 0 | 0 | | 0 | 0 | 0 | 0 | | 0 | 0 | 0 | 50 | 49 | 48 | 47 |
| N(3) Tpost (N3) | 0 | 0 | 0 | 50 | | 6 | 5 | 4 | 3 | 2 | 1 | 0 | | 0 | 0 | 0 | 0 | | 0 | 0 | 0 | 0 | 0 | 0 | 0 |

The embodiment of the present invention presents details of how "rolling" timestamps work. The following is an example showing the axons and neurons firing at respective timesteps. The example uses value B=50 ms, and shows timesteps 0 to 102. Assuming each of the timesteps is a nominal value of 1 ms, consider the 4×4 scenarios as shown in FIG. 7.

At timestep 0: No event of any of the axons or neurons occurs.

At timestep 1:
A0 fires, Tpre(A0)=50; Tpost(N0) through Tpost(N3) are 0s. Since all of the Tpost are 0s, no comparison is triggered.

At timestep 2:
Tpre(A0) decrement by 1, Tpre(A0)=49;
N1 fires, Tpost(N1)=50. Since N1 fires, Tpre(A0) and Tpost(N1) are non-zero, and thus the compare operation is triggered.
Tpost(N1)−Tpre(A0)=50−49=1, indicates a Strong LTP and thus flow proceeds to the lookup LTP Table for locating the value to increase the weight in the next step.

Intuitively, this makes sense since A0 fires 1 timestep before N1 fires, showing a high probability of a causal relationship, that is, the firing of N1 may be caused by or partly by A0.

(FSM)" 720 may only trigger the RMW update of the selected rows of the memory weight, when at least one of the LTP/LTD table lookup value is non-zero. Otherwise, the FSM can skip to the next row of the memory weight selected. The RMW updating mechanism can eliminate unnecessary updating when all of the LTP/LTD table lookup values are zero, resulting in a faster and accurate performance and substantial power saving.

Overall, with 1 ms timestep, a 1024×1024×(N+2) bits DRAM array, if each row read and write time are 45 ns, assuming LIF compute takes 50 ns, and STDP compute takes 100 ns, and if every row needs to be updated in every timestep, then the worst case percentage time the LIF/STDP circuit will be active is:
LIF mode takes 1024×(45+50)ns=97.28 us
STDP mode takes 1024×(45+100)ns=148.48 us
Total about 245 us or <24.5% of the timestep is needed to complete LIF/STDP time multiplexed operations.

But based on SNN theory, the numbers of axons or neurons firing are relatively sparse, so only the rows having axons or neurons firing may need to be updated at each timestep. Thus, with the SNN sparsity, the circuit can be <2% time active on average. The relatively low number of axons or neurons firing can result in the STDP circuit being activated less than 2% of a timestep, and hence such circuit consumes relatively low power.

Figure 8:
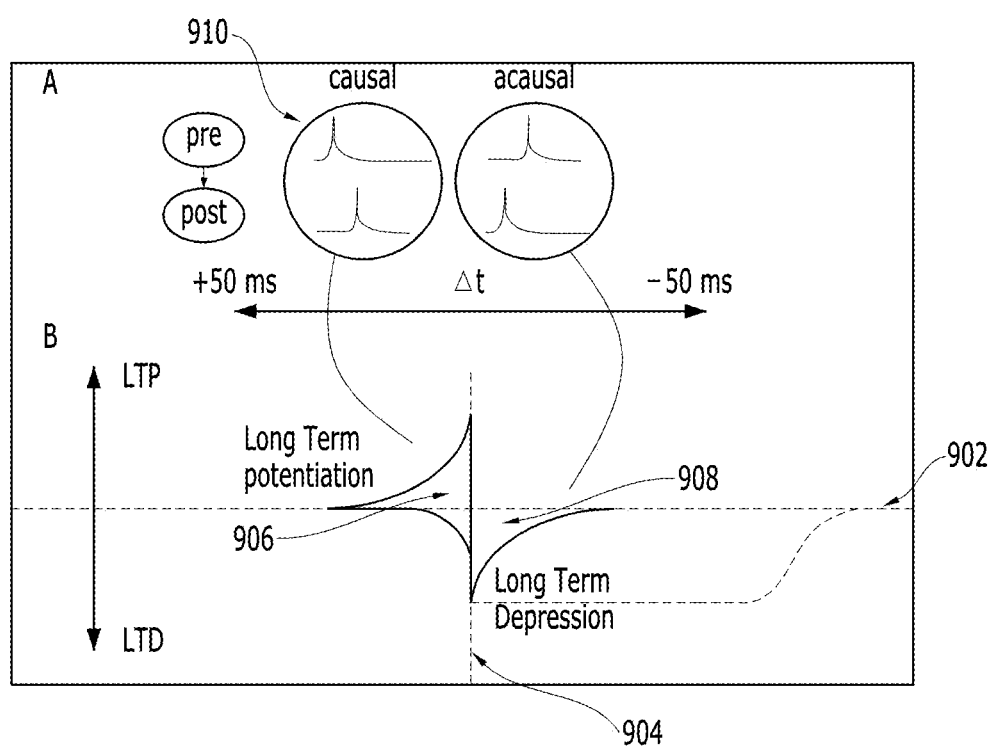
FIG. 8 is a diagram illustrating LTP/LTD curves in accordance with an embodiment of the present invention.

Referring now to FIG. 8, herein is shown a diagram illustrating LTP/LTD curves in accordance with an embodiment of the present invention.

In the SNN theory, online learning can be performed by Spike-Timing-Dependent-Plasticity (STDP). The STDP can be a biological process that adjusts the strength of connections (synapses) between neurons in the brain. The STDP enables the online learning by increasing or decreasing the synapse strengths or synaptic weights based on the "causal" or "acausal" relationship between the input and output spikes respectively.

Under the STDP process, if an input spike to a neuron tends, on average, to occur immediately before that neuron's output spike, then that particular input is made somewhat stronger. If an input spike tends, on average, to occur immediately after an output spike, then that particular input is made somewhat weaker, hence STPD.

Thus, inputs that might be the cause of the post-synaptic neuron's excitation are made even more likely to contribute in the future are called LTP or Long Term Potentiation, whereas inputs that are not the cause of the post-synaptic spike are made less likely to contribute in the future are called LTD or Long Term Depression. The process continues until a subset of the initial set of connections remains, while the influence of all others is reduced to 0.

The magnitude of the causal or acausal relationship is indicated by the relative timing of an input spike to a neuron's output spike. Using a certain time bound, e.g., +/−50 ms, the further away from the output spike time, the less strength will apply, both for LTP (excitatory) or LTD (inhibitory). To implement online learning, the STDP circuit can be used on every synapse and the circuitry can be very complex.

As shown in FIG. 8, a horizontal axis 902 can represent the relative timing of an input spike to a neuron's output spike, such as $\Delta t$, while a vertical axis 904 can represent the magnitude of the causal or acausal relationship. The closer the relative timing of an input spike to a neuron's output spike is, such as when $\Delta t$ approaches 0, the stronger the magnitude of the causal or acausal relationship is.

A region 906 can represent the LTP value in accordance with $\Delta t$. When the input spike (pre) occurs before the output spike (post), as shown in circle 910, $\Delta t$ is positive. When the input spike occurs immediately before the output spike, $\Delta t$ can approach to zero, the magnitude of the LTP can reach a maximum value. Thus, the inputs that might be the cause of the post-synaptic neuron's excitation are made most likely to contribute in the future, when the input spike occurs immediately before the output spike. The further away the input spike occurs from the output spike, such that $\Delta t$ is greater, the weaker of the strength or the magnitude of LTP is. When $\Delta t$ reaches a limit, the strength or magnitude of the LTP can be as weak as zero. Thus, the inputs that might be the cause of the post-synaptic neuron's excitation are made least likely to contribute in the future, when the input spike occurs much earlier before the output spike.

A region 908 can represent the LTD value in accordance with $\Delta t$. When the input spike (pre) occurs after the output spike (post), as shown in circle 912, $\Delta t$ is negative. When the input spike occurs immediately after the output spike, $\Delta t$ can approach to zero, the magnitude of the LTD can reach negative maximum. Thus, the inputs that might not be the cause of the post-synaptic neuron's excitation are made less likely to contribute in the future. The further the input spike occurs away from the output spike, such that $\Delta t$ is greater, the weaker of the strength or the magnitude of LTD is. When $\Delta t$ reaches a limit, the strength or magnitude of the LTD can be as weak as zero. Thus, the inputs that might be the cause of the post-synaptic neuron's excitation are made least likely to contribute in the future, when the input spike occurs much later after the output spike.

The synaptic weights can be determined in accordance with multiple factors. The LTP/LTD curves shown in FIG. 8 can be used to determine the strength and magnitude of the LTD/LTP, and the synaptic weights. The LTP/LTD curves can be implemented as the LTP/LTD lookup table of FIG. 7.

Figure 9:
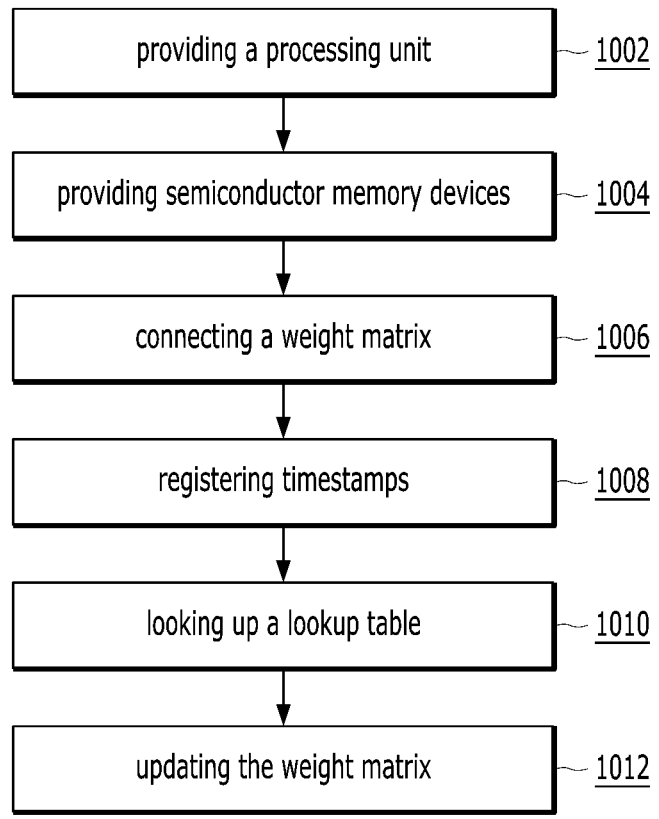
FIG. 9 is a flow chart illustrating an operating method of a conceptual DRAM-based SNN LIF and time-multiplexed STDP architecture in accordance with a further embodiment of the present invention.

Referring now to FIG. 9, herein is shown a flow chart illustrating an operating method of a conceptual DRAM-based SNN LIF and time-multiplexed STDP architecture in accordance with a further embodiment of the present invention. The method can include: providing a processing unit (1002); providing semiconductor memory devices coupled to the processing unit, the semiconductor memory devices containing instructions executed by the processing unit (1004); connecting a weight matrix to axons and neurons, the weight matrix is constructed with rows and columns of memory cells, inputs of the memory cells of a same row are connected to one of the axons, outputs of the memory cells of a same column are connected to one of the neurons (1006); registering timestamps of the axons and the neurons into timestamp registers (1008); looking up adjusting values from a lookup table, the adjusting values of the lookup table are indexed in accordance with the timestamps (1010); and updating the weight matrix in accordance with the adjusting values by the processing unit (1012).

Figure 10:
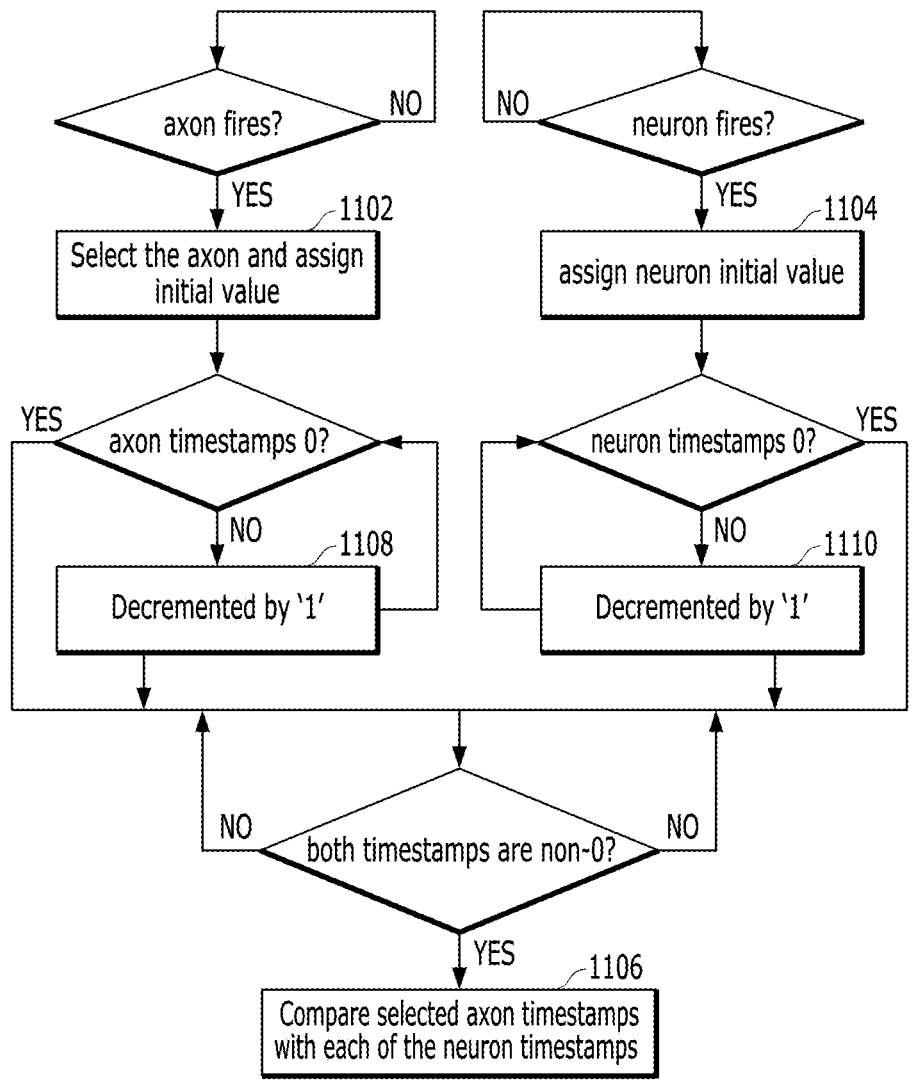
FIG. 10 is a flow chart illustrating registering timestamps of axons and neurons into timestamp registers of FIG. 9 in accordance with a further embodiment of the present invention.

Referring now to FIG. 10, herein is shown a flow chart illustrating the registering the timestamps of the axons and the neurons into timestamp registers of FIG. 9 in accordance with a further embodiment of the present invention. The flow chart can include: generating a selected axon timestamp from axon timestamps (1102), each of the axon timestamps corresponding to one of the axons; generating neuron timestamps for the neurons (1104), each of the neuron timestamps corresponding to one of the neurons; comparing the selected axon timestamp with each of the neuron timestamps by a comparison circuit (1106), when one of the axons fires, or one of the neurons fires, or the combination thereof fire, and the selected axon timestamp and at least one of the neuron timestamps are non-zero; and wherein the generating the timestamp for each of the axons or the neurons by decreasing the predetermined value at each of subsequent timesteps by a time stamping circuit (1108 and 1110, respectively).

Figure 11:
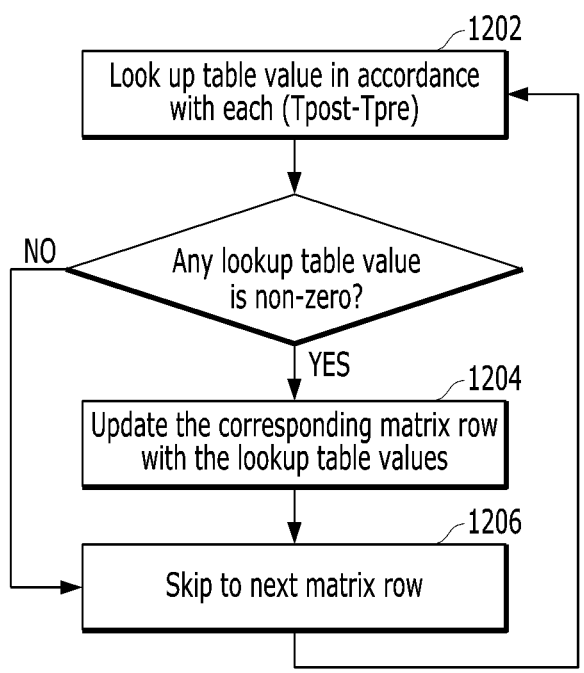
FIG. 11 is a flow chart illustrating updating matrix rows according to values of the LTD/LTP lookup table of FIG. 9 in accordance with a further embodiment of the present invention.

Referring now to FIG. 11, herein is shown a flow chart illustrating updating a matrix row according to values of the LTD/LTP lookup table of FIG. 9 in accordance with a further embodiment of the present invention. The flow chart can include: looking up values of the LTD/LTP lookup table in accordance with the calculating results of Tpost-Tpre (1202), wherein Tpre is the timestamp of the selected axon and Tpost is the timestamp of each of the neurons, when any of the axons and neurons fires; updating the corresponding matrix row with the lookup values (1204), when any of the lookup values is non-zero; skipping to the next matrix row (1206), when all of the lookup values are zero.

It has been discovered that the specialized neural network accelerators in the embodiments of the present invention can provide higher performance of delivering the highest de-facto metrics of Giga-Operations Per Second (GOPS)/sec/watt or images/sec/watt, lower latency of providing real-time or near-real-time inference and classifications, lower power of deployment of NN in power-constrained mobile and Internet of Things (IoTs) devices including drones and robots, and offloading CPU by offloading the host CPU to run software and algorithms in parallel with inference tasks.

The memory-centric feature of the specialized neural network accelerator hardware can significantly reduce the silicon overhead because of the reduction of routing traffic across the core of the chip, resulting in better efficiency and higher performance.

Thus, it has been discovered that the architecture of a neural network accelerator of the present invention furnishes important and heretofore unknown and unavailable solutions, capabilities, and functional aspects for a unified optimized acceleration architecture. The resulting method, process, apparatus, device, product, and/or system is straightforward, cost-effective, uncomplicated, highly versatile and effective, can be surprisingly and unobviously implemented by adapting known technologies, and thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the foregoing description. Accordingly, it is intended that the invention embrace all such alternatives, modifications, and variations that fall within the scope of the included claims. All matters set forth herein or shown in the accompanying drawings are to be interpreted in an illustrative and non-limiting sense.

What is claimed is:

1. An operating method of a memory-centric neural network system comprising:
    providing a processing unit;
    providing semiconductor memory devices coupled to the processing unit, the semiconductor memory devices containing instructions executed by the processing unit;
    connecting a weight matrix having positive and negative weights to axons and neurons, wherein the weight matrix is constructed with rows and columns of memory cells, inputs of the memory cells of a same row are connected to one of the axons, and outputs of the memory cells of a same column are connected to one of the neurons;
    registering rolling timestamps of the axons and the neurons into respective axon timestamp registers and neuron timestamp registers, wherein the rolling timestamps for the axons and the rolling timestamps for the neurons are initiated at respective firing of the axons and neurons and respectively count downwards in time from an initial value to zero and stay at zero in subsequent timesteps;
    looking up adjusting values from a lookup table, wherein the adjusting values of the lookup table are indexed in accordance with the rolling timestamps; and
    updating the weight matrix in accordance with the adjusting values by the processing unit,
    wherein the registering of the rolling timestamps includes, at each of multiple of the rolling timesteps, comparing a selected axon timestamp, selected from a plurality of axon timestamps, with each of the neuron timestamps, only when a) one of the axons fires, one of the neurons fires, or a combination thereof fires, and b) the selected axon timestamp and at least one of the neuron timestamps are non-zero,
    wherein a non-zero timestamp of the selected axon timestamp is compared to a non-zero fired neuron timestamp, and
    wherein the updating of the weight matrix includes updating a selected row of the weight matrix of a selected axon with an adjusting value from the lookup table when at least one of the adjusting values in the lookup table is non-zero, and skipping to another row of the weight matrix of another selected axon when none of the adjusting values in the lookup table is non-zero.

2. The method of claim 1, wherein the registering the timestamps includes
    generating the selected axon timestamp from the plurality of axon timestamps, each corresponding to one of fired axons,
    generating neuron timestamps for fired neurons, each of the neuron timestamps corresponding to one of the fired neurons, wherein
    the comparing is performed using a comparison circuit.

3. The method of claim 1, wherein the registering of the timestamps includes registering a predetermined value when a corresponding axon or a corresponding neuron fires, and the timestamps are generated for each of the axons or the neurons by decreasing the predetermined value at each subsequent timestep by a time stamping circuit.

4. The method of claim 1, wherein the connecting of the weight matrix includes connecting a dynamic random-access memory (DRAM).

5. The method of claim 1, wherein the looking up of the adjusting values from the lookup table includes generating comparing results of the selected axon timestamp and each non-zero fired neuron timestamp, and determining the adjusting values in accordance with the comparing results.

6. The method of claim 5, wherein the updating of the weight matrix includes:
    increasing weights of rows of the weight matrix of the selected axon for a next step by the adjusting values, when the comparing results are positive, and
    decreasing the weights of the rows of the weight matrix of the selected axon for the next step by the adjusting values, when the comparing results are negative.

7. The method of claim 1, wherein the registering of the timestamps includes selecting one of the axons for updating a corresponding row of the weight matrix by a selective circuit, and repeatedly selecting another one of the axons until all of the axons are selected.

8. The method of claim 1, wherein the connecting the weight matrix includes
    connecting the inputs of the memory cells at the same row of the weight matrix to one of the corresponding axons, and
    connecting the outputs of the memory cells at the same column of the weight matrix to one of the corresponding neurons.

9. The method of claim 8, further comprising:
    calculating a neuron value of each of the corresponding neurons, in accordance with whether the corresponding neurons fire, whether the corresponding neurons is connected with the axons, and whether weights of the corresponding neurons are negative or positive,
    compensating the neuron value with a leak value by an adder, and generating a membrane voltage for each of the neurons, and comparing the membrane voltage with a threshold value Vth by a comparison circuit, the corresponding neurons fire when the membrane voltage thereof is greater than the threshold value Vth.

10. A memory-centric neural network system comprising:
a processing unit;
semiconductor memory devices coupled to the processing unit, the semiconductor memory devices containing instructions executed by the processing unit;
a weight matrix having positive and negative weights constructed with rows and columns of memory cells, wherein inputs of the memory cells of a same row are connected to one of multiple axons, and outputs of the memory cells of a same column are connected to one of multiple neurons;
timestamp registers comprising axon timestamp registers and neuron timestamp registers for registering rolling timestamps of the axons and the neurons, wherein the rolling timestamps for the axons and the rolling timestamps for the neurons are initiated at respective firing of the axons and neurons and respectively count downwards in time from an initial value to zero and stay at zero in subsequent timesteps; and
a lookup table containing adjusting values indexed in accordance with the rolling timestamps, wherein the processing unit updates the weight matrix in accordance with the adjusting values,
wherein the timestamp registers include a comparison circuit-which, at each of multiple of the rolling timesteps, compares a selected axon timestamp, selected from a plurality of axon timestamps, with each of the neuron timestamps, only when a) one of the axons fires, one of the neurons fires, or a combination thereof fires, and b) the selected axon timestamp and at least one of the neuron timestamps are non-zero,
wherein the comparison circuit compares a non-zero timestamp of the selected axon timestamp to a non-zero fired neuron timestamp, and
wherein the process unit updating the weight matrix includes updating a selected row of the weight matrix of a selected axon with an adjusting value from the lookup table when at least one of the adjusting values in the lookup table is non-zero, and skipping to another row of the weight matrix of another selected axon when none of the adjusting values in the lookup table is non-zero.

11. The system of claim 10, wherein the axon timestamp registers register the plurality of axon timestamps, each of the axon timestamps corresponding to one of fired axons, and
wherein
the neuron timestamp registers register neuron timestamps, each of the neuron timestamps corresponding to one of fired neurons, and the system further comprises a comparison circuit for performing the comparing operation.

12. The system of claim 10, wherein the timestamp registers register a predetermined value when a corresponding axon or a corresponding neuron fires, and a time stamping circuit generates the timestamp for each of the axons or the neurons by decreasing the predetermined value at each subsequent timestep.

13. The system of claim 10, wherein the weight matrix is implemented by a dynamic random-access memory (DRAM).

14. The system of claim 10, wherein the adjusting values of the lookup table are determined by generating comparing results of the selected axon timestamp and each non-zero fired neuron timestamp, and determining the adjusting values in accordance with the comparing results.

15. The system of claim 14, wherein the rows of the weight matrix are updated with the adjusting values by:
increasing weights of the row of the weight matrix of the selected axon for a next step by the adjusting values, when the comparing results are positive, and
decreasing the weights of the rows of the weight matrix of the selected axon for the next step by the adjusting values, when the comparing results are negative.

16. The system of claim 10, wherein the timestamp registers include a selective circuit selecting one of the axons for updating a corresponding row of the weight matrix, and repeatedly selecting another one of the axons until all of the axons are selected.

17. The system of claim 10, wherein the weight matrix
connects the inputs of the memory cells at the same row of the weight matrix to one of the corresponding axons, and
connects the outputs of the memory cells at the same column of the weight matrix to one of the corresponding neurons.

18. The system of claim 17, wherein each of the neurons includes:
a calculation circuit calculating a neuron value of each neuron, in accordance with whether the corresponding neuron fires, whether the corresponding neuron is connected with the axons, and whether weights of the corresponding neurons are negative or positive,
an adder compensating a subtraction result with a leak value, and generating a membrane voltage for each of the neurons, and
a comparison circuit comparing the membrane voltage with a threshold value Vth, wherein the corresponding neurons fire when the membrane voltage thereof is greater than the threshold value Vth.

* * * * *